(12) United States Patent
Ohhara et al.

(10) Patent No.: US 7,314,492 B2
(45) Date of Patent: Jan. 1, 2008

(54) METHOD FOR MANUFACTURING ALKALINE BATTERY

(75) Inventors: Takumi Ohhara, Fukushima (JP); Satoshi Sato, Fukushima (JP)

(73) Assignee: Sony Corporation, Tokyo (JP)

( * ) Notice: Subject to any disclaimer, the term of this patent is extended or adjusted under 35 U.S.C. 154(b) by 686 days.

(21) Appl. No.: 10/834,673

(22) Filed: Apr. 29, 2004

(65) Prior Publication Data

US 2004/0221446 A1    Nov. 11, 2004

(30) Foreign Application Priority Data

May 7, 2003  (JP)  .......................... P2003-129637

(51) Int. Cl.
*H01M 4/82* (2006.01)
*H01M 2/08* (2006.01)
*H01M 4/34* (2006.01)
*H01M 4/00* (2006.01)
*H01M 4/50* (2006.01)

(52) U.S. Cl. .................. 29/623.5; 429/174; 429/175; 429/219; 429/223; 429/224; 429/229

(58) Field of Classification Search ................ 429/175, 429/174, 219, 223, 224, 229; 29/623.1, 623.5
See application file for complete search history.

(56) References Cited

U.S. PATENT DOCUMENTS 6,794,082 B2 *  9/2004  Mori et al. .................. 429/174

* cited by examiner

*Primary Examiner*—Patrick Joseph Ryan
*Assistant Examiner*—Thomas H. Parsons
(74) *Attorney, Agent, or Firm*—Sonnenschein Nath & Rosenthal LLP

(57) ABSTRACT

In a method in which the inside surface of the negative electrode cup of an alkaline battery is coated with metal or metal alloy having a higher hydrogen overpotential than copper, the mask used for coating processing has the shape in which: when d is the diameter of the negative electrode cup, t is the plate thickness of the negative electrode cup, A is the diameter of the mask opening on the negative electrode cup mounting side, B is the diameter of the mask opening on the negative electrode cup supplying side, h is the depth of the negative electrode cup, C is the thickness of mask on negative electrode cup mounting side, and D is a tapered angle of the mask opening on the negative electrode cup, $2(2t+d)-B>A \geq 0.7d$, $(A/2)-h \geq C>0$ mm, and $90°>D \geq 45°$ are satisfied to coat only the inside surface area except a cuff portion and cuff bottom portion.

6 Claims, 3 Drawing Sheets

METHOD FOR MANUFACTURING ALKALINE BATTERY

BACKGROUND OF THE INVENTION

1. Field of the Invention

The present invention relates to a method suitable for use in manufacturing a coin-type or button-type alkaline battery used in small-sized electronic equipment such as an electronic wrist watch, an electronic desk calculator, or the like.

2. Description of the Related Art

Conventionally, as an alkaline battery of a coin type or button type used in an electronic wrist watch, electronic desk calculator, or other small-sized electronic equipment, there has been proposed the one shown in FIG. 3. With reference to FIG. 3, an example of a button-type alkaline battery will be explained.

In FIG. 3, numeral 1 denotes positive electrode mixture containing silver oxide or manganese dioxide as a positive active material, and in this example the positive electrode mixture 1 is formed into a pellet of a coin shape. The positive electrode mixture of the coin-shaped pellet is provided in a positive electrode can 2, which is composed of a nickel-plated stainless steel plate and functions as a positive electrode terminal and a positive electrode current collector.

Also, numeral 3 denotes negative electrode mixture in gel state without mercury, containing zinc or zinc alloy powder as a negative active material and composed of alkaline electrolyte such as sodium hydroxide aqueous solution or potassium hydroxide aqueous solution, thickener, and the like; and the negative electrode mixture 3 is provided in a negative electrode cup 4 functioning as a negative electrode terminal and a negative electrode current collector.

Between the positive electrode mixture 1 and the negative electrode mixture 3, a separator 5 composed of a graft-polymerized three-layer film consisting of non woven fabric, cellophane, and polyethylene is provided. Then, the separator 5 is impregnated with alkaline electrolyte, for example, sodium hydroxide aqueous solution or potassium hydroxide aqueous solution.

A gasket 6 made of nylon is provided on the inner periphery of the positive electrode can 2 between the upper surface of the separator 5, and a cuff portion 4a and a cuff bottom portion 4b of the negative electrode cup 4; and the positive electrode can 2 is swaged and caulked to be hermetically sealed.

As shown in FIG. 4, the negative electrode cup 4 in this example is formed of a three-layer clad member made of nickel (Ni) 7, stainless 8, and copper (Cu) 9; and on the periphery thereof the cuff portion 4a and cuff bottom portion 4b are provided. Then, the inside surface area of copper 9 other than the cuff portion 4a and cuff bottom portion 4b is coated with stannum (Sn) having a higher hydrogen overpotential than copper to provide a stannum coating layer 10.

There has been known such an example of Patent document 1, in which only on the inside surface area of copper 9 other than the cuff portion 4a and cuff bottom portion 4b is coated with stannum (Sn) to provide the stannum coating layer 10. In Patent document 1, the art relating to a coin type and button type alkaline battery is described in which the inside surface of the negative electrode cup 4 other than the cuff portion 4a and cuff bottom portion 4b thereof is coated with metal or metal alloy having a higher hydrogen overpotential than copper by means of a dry-type film forming method.

In the above alkaline battery, hydrogen gas ($H_2$) can be prevented from being generated, and since metal or metal alloy without using mercury having a higher hydrogen overpotential than copper is not deposited on the cuff portion 4a and cuff bottom portion 4b of the negative electrode cup 4, rising-up of the alkaline electrolyte (creep phenomenon) can be prevented and liquid leakage resistance is not deteriorated; and further since metal or metal alloy having a higher hydrogen overpotential than copper is deposited by means of a dry-type film forming method, the cuff portion 4a and cuff bottom portion 4b of the copper surface 9 are not oxidized, so that the liquid leakage resistance can be maintained against the creep phenomenon of the alkaline electrolyte.

Conventionally, when the inside surface area other than the cuff portion 4a and cuff bottom portion 4b made of copper 9 of the negative electrode cup 4 is coated with stannum (Sn) having a higher hydrogen overpotential than copper to provide the stannum coated layer 10, sputtering has been used. A mask used for sputtering in Patent document 1 is, for example, shown in FIG. 1, in which a circular counter-boring portion of 6 mm in diameter where the negative electrode cup 4 is mounted and fastened with a screw and a circular opening of 5 mm in diameter provided at the center of the counter-boring portion causing sputtering atoms to reach the inside of the negative electrode cup 4 are provided; and a negative electrode cup mounting portion 21C is formed on the negative electrode cup mounting side of the mask 21. The negative electrode cup 4 is set such that the negative electrode cup mounting portion 21C is covered by the negative electrode cup 4 put from the negative electrode cup supplying side (from the upper side in the figure), and then sputtering atoms are projected from the negative electrode cup mounting side (from the lower side in the figure) to be deposited. The mask is made of comparatively thin metal plate or the like and is shaped having the negative electrode cup mounting portion 21C as illustrated.

[Patent Document 1]

Japanese Published Patent Application 2002-198014 (page 2, FIG. 3)

A conventional mask 21 proposed in the above mentioned Patent document 1 and used in sputtering, when partly depositing film such that the inside surface area other than the cuff portion 4a and cuff bottom portion 4b of the negative electrode cup 4 is coated, has a required opening provided in a comparatively thin metal plate or the like to deposit a film on a predetermined portion of the inside surface of the negative electrode cup 4. However, the mask 21 is deformed by heat generated in sputtering or the like to cause position dispersion with respect to the negative electrode cup 4 mounted on the mask 21, so that the stannum coating layer 10 can not be favorably formed on the negative electrode cup 4, which results in inconvenience when mass production of the negative electrode cup 4 is conducted.

Further, such deformation generates gap between the negative electrode cup 4 and the negative electrode cup mounting portion 21C, so that there occurs possibility of depositing metal or metal alloy having a higher hydrogen overpotential than copper on the cuff bottom portion 4b or other areas; and also there is a problem of a shorter operating life due to the thin plate thickness of the mask, in which such deformation as accompanied by elimination and cleaning of an excessively-coated film adhered to the mask 21 occurs, because necessary chamber maintenance is periodically performed for stabilizing the quality of film in a film depositing apparatus at mass production.

In light of the above, the present invention provides a method for manufacturing an environmentally-benign alkaline battery without containing mercury (Hg), in which a mask used when PVD (physical vapor deposition) method of a dry-type film forming method is employed is appropriately shaped and the inconvenience at mass production of the negative electrode cup is improved.

SUMMERY OF THE INVENTION

A method for manufacturing an alkaline battery according to the present invention is the manufacturing method of forming and processing a coating of a negative electrode cup by means of a PVD method such as deposition, sputtering, ion plating, and the like, in which the coating is performed using a mask with a mask opening in the shape that satisfies $2(2t+d)-B \geq A \geq 0.7d$, where d is the inside diameter of a negative electrode cup, t is the thickness of the negative electrode cup, A is the diameter of the mask opening on the negative electrode cup mounting side, and B is the diameter of the mask opening on the negative electrode cup supplying side; and that satisfies $(A/2)-h \geq C > 0$ mm, where h is the depth of the negative electrode cup, and C is the thickness of the mask on the negative electrode cup mounting side, with a tapered angle D of the mask opening on the negative electrode cup mounting side being $90° > D \geq 45°$.

According to the method for manufacturing an alkaline battery of the present invention, there is provided the mask in which, for example, the diameter of the mask opening on the negative electrode cup mounting side A is approximately 5 mm, the depth from the negative electrode mounting surface $11d$ to the mask opening E is thickened into approximately 5 mm, which is conventionally 0.2 mm, and the tapered angle of the mask opening on the negative electrode cup mounting side is made to be 45°. As described above, since the plate is made thicker and the taper is provided so that sputtering atoms are not blocked their paths by the mask, coating by means of sputtering is performed without damaging the uniformity thereof; and since the mask is made thicker, dispersion with respect to the position of the negative electrode cup caused by deformation of the mask due to heat or the like on sputtering and deformation of the mask caused when an excessive coating adhered to the mask is removed for cleaning is reduced, so that the operating life of the mask becomes longer and suitable for use in the mass production.

DESCRIPTION OF THE PREFERRED EMBODIMENTS

Hereinafter, an embodiment of the method for manufacturing an alkaline battery according to the present invention will be described with reference to the drawings.

Figure 3:
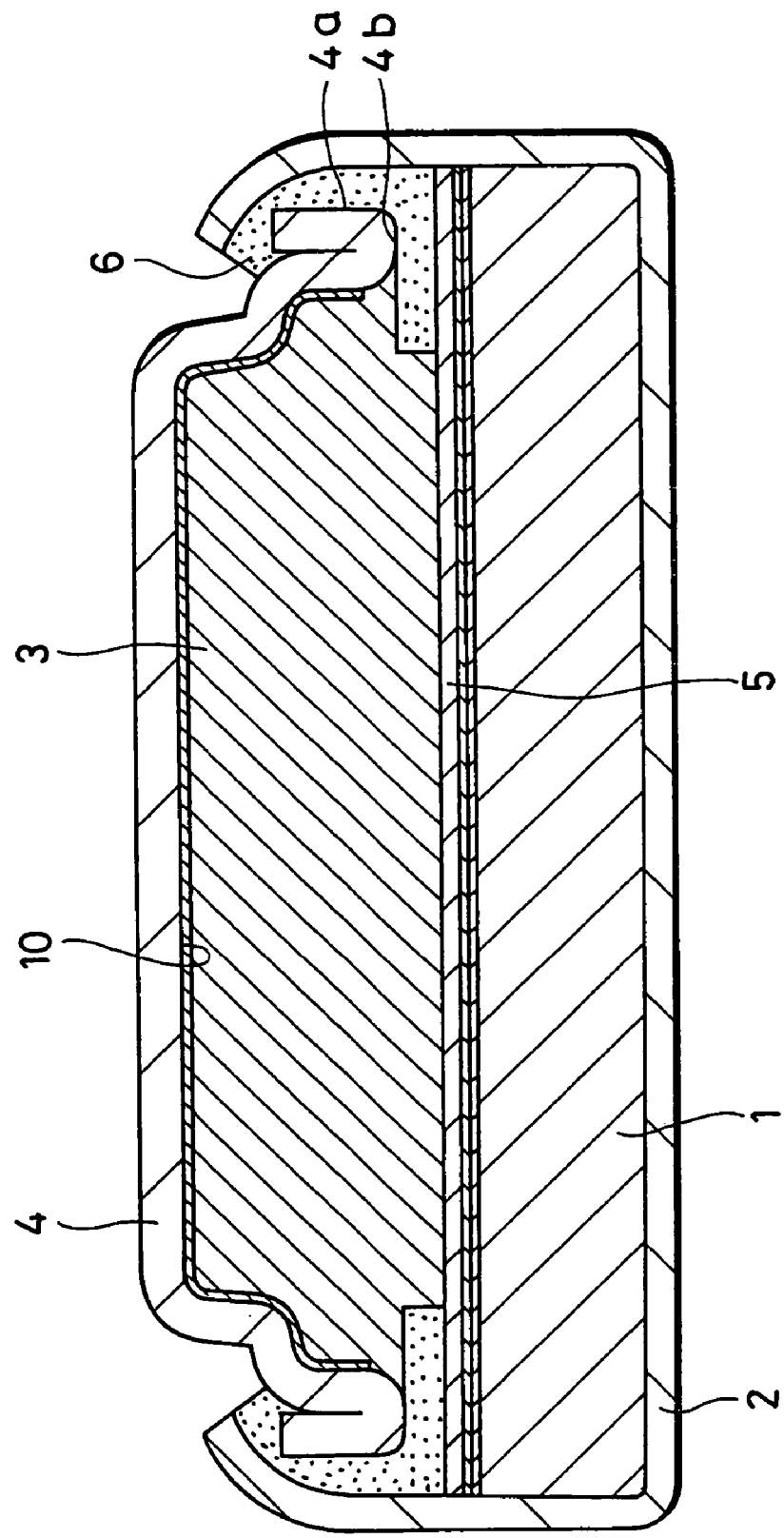
FIG. 3 is a cross-sectional view showing an embodiment of an alkaline battery according to the present invention.

An example of the alkaline battery according to the embodiment of the present invention is shown in FIG. 3. In FIG. 3, numeral 1 denotes positive electrode mixture having silver oxide or manganese dioxide as a positive active material and in this example the positive electrode mixture 1 is formed into a pellet of a coin shape. The positive electrode mixture 1 in coin shape is provided in a positive electrode can 2 made of a stainless steel plate with nickel plating, functioning as a positive terminal and a positive current collector.

Further, numeral 3 denotes negative electrode mixture in a gel state that has zinc (Zn) or zinc alloy powder as a negative active material without containing mercury, formed of alkaline electrolyte such as sodium hydroxide aqueous solution or potassium hydroxide aqueous solution, thickener, and the like; and the negative electrode mixture 3 is provided in a negative electrode cup 4 functioning as a negative electrode and a negative electrode current collector.

Between the positive electrode mixture 1 and the negative electrode mixture 3, a separator 5 composed of a three-layer film consisting of non woven fabric, cellophane, and polyethylene through graft polymerization is provided. Then, the separator 5 is impregnated with alkaline electrolyte, for example, sodium hydroxide aqueous solution or potassium hydroxide aqueous solution.

A gasket 6 made of nylon is provided on the inside periphery of the positive electrode can 2 between the upper surface of the separator 5 and a cuff portion $4a$ and cuff bottom portion $4b$ of the negative electrode cup 4; and the positive electrode can 2 and negative electrode cup 4 are swaged and caulked to be hermetically sealed.

Figure 4:
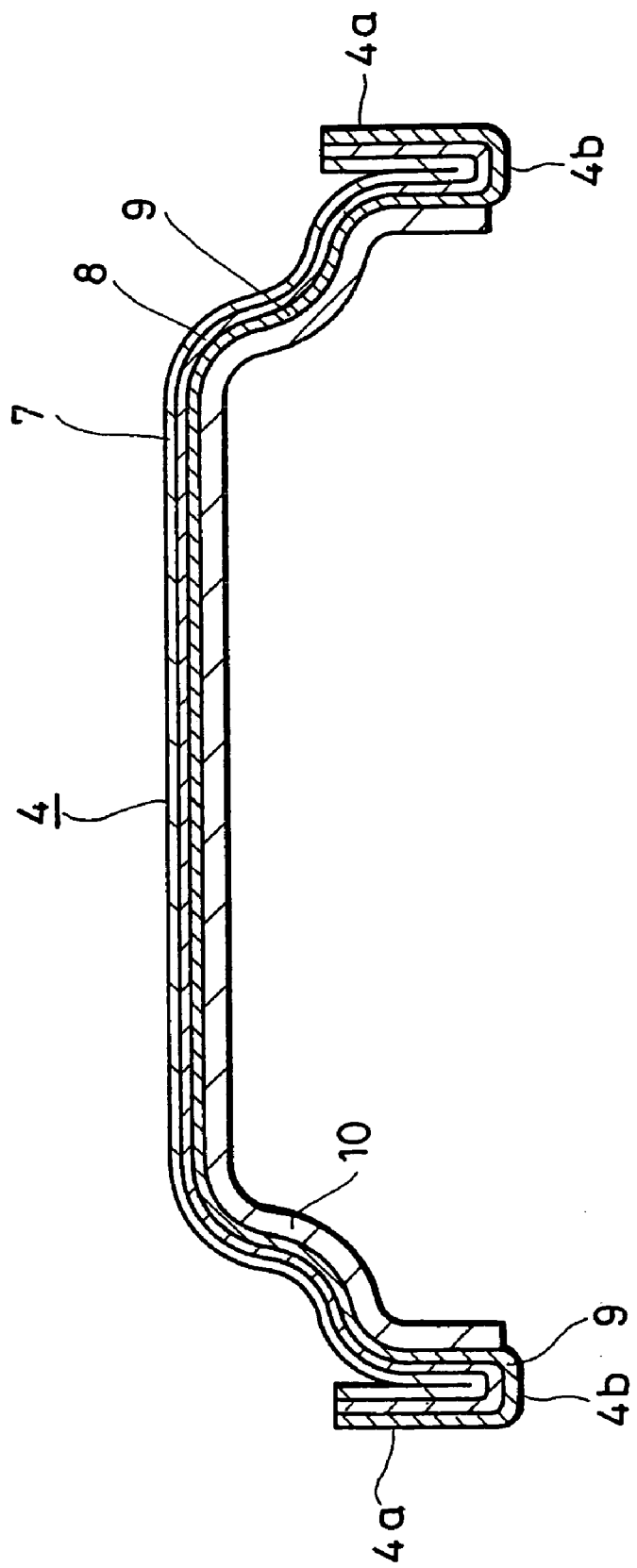
FIG. 4 is a cross-sectional view of an example of the negative electrode cup of FIG. 3.

In this example, as shown in FIG. 4, the negative electrode cup 4 is formed of a three-layer clad material made of nickel 7, stainless 8, and copper 9; and on the periphery thereof the cuff portion $4a$ and cuff bottom portion $4b$ are provided.

Further, the inside surface area of copper 9 other than the cuff portion $4a$ and cuff bottom portion $4b$ is coated by sputtering that is one of PVD methods with stannum (Sn) having a higher hydrogen potential than copper to provide a stannum coating layer 10.

Figure 1:
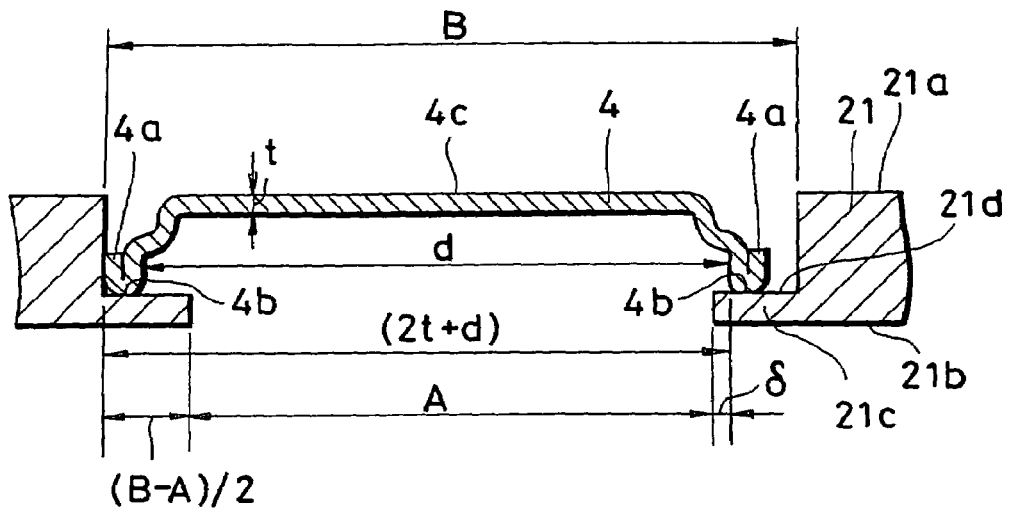
FIG. 1 is a cross-sectional view for explaining the shape of a conventional negative electrode cup and mask.
Figure 2:
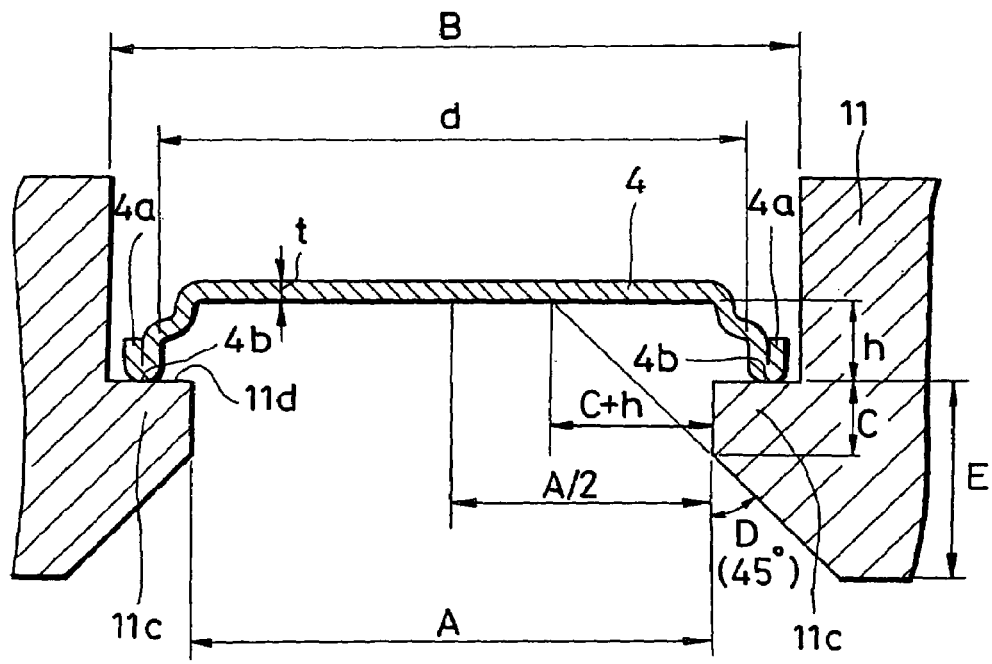
FIG. 2 is a cross-sectional view for explaining the shape of a negative electrode cup and mask according to the present invention.

A mask 11 hereupon used for partly forming a coating by sputtering is shown in FIG. 2. The mask 11 has the shape that satisfies the formula $$2(2t+d)-B \geq A > 0.7d \qquad (1),$$

where A is the diameter of a mask opening on the negative electrode cup mounting side, B is the diameter of the mask opening on the negative electrode cup supplying side, d is the inside diameter of the negative electrode cup, and t is the thickness of the negative electrode cup. With the dimensions described above, even if the position of the negative electrode cup 4 is shifted on the cup mounting surface $11d$ toward the side wall of the mask opening on the mounting side of the negative electrode cup, the cuff bottom portion $4b$ of the negative electrode cup 4 is not exposed to the inside of the mask opening on the negative electrode cup mounting side, so that only the inside surface area of the negative electrode cup 4 other than the cuff portion $4a$ and cuff bottom portion $4b$ is coated.

Further, the mask opening on the negative electrode cup mounting side has the shape, in which when h is the depth of the negative electrode cup, C is the thickness of the mask on the negative electrode cup mounting side, and D is a tapered angle of the mask opening on the negative electrode cup mounting side, the formula $$(A/2)-h \geq C > 0 \text{ mm} \qquad (2)$$

is satisfied and the formula $$90° > D \geq 45° \qquad (3)$$

is satisfied. With the above described shape, when sputtering atoms entering the outside portion from the center of the negative electrode cup 4 in the oblique direction at an angle of 45° or more is selected to be the reference dimensions, the sputtering atoms entering in the oblique direction are not blocked by the mask and the film thickness on the inside wall surface is not made thin. Accordingly, the thickness of the mask according to this embodiment is increased to provide a mask having the opening of dimensions suitable for the mass production.

According to the embodiment, as shown in practice examples 1 and 2 of Table 1, since a stannum coating layer 10 having a higher hydrogen overpotential than copper is formed on the inside surface of the negative electrode cup 4 by sputtering of a PVD method, hydrogen gas ($H_2$) is prevented from being generated. Further, since the cuff bottom portion 4b of the negative electrode cup 4 is not exposed to the inside of the mask opening on the negative electrode cup mounting side even if the negative electrode cup 4 is shifted on the cup mounting surface 11d when the coating is performed, the coating layer is not formed on the cuff portion 4a and cuff bottom portion 4b of the negative electrode cup 4 and a copper surface of the gasket seal portion in which rising-up of alkaline electrolyte is less than the stannum coating layer 10 remains, and the copper surface 9 that is a base member of the cuff portion 4a and cuff bottom portion 4b of the negative electrode cup 4 is not oxidized, so that liquid leakage resistance is secured.

is, 2(2t+d)−B=5.0 mm>A(=4.16 mm). In the practice example 1, an alkaline battery in button shape shown in FIG. 3 is manufactured using the above described negative electrode cup 4.

Specifically, as shown in FIG. 3, alkaline electrolyte consisting of sodium hydroxide aqueous solution of 28% by weight is injected into the positive electrode can 2; then a pellet of coin shape formed of positive electrode mixture 1 containing silver oxide, manganese dioxide, and polyethylene tetrafluoride is inserted; and the alkaline electrolyte is impregnated into the positive electrode mixture.

Then, a separator 5 of a punched out circular shape having a three-layer structure made of graft-polymerized film formed of polyethylene and cellophane laminated and non woven fabric is set on the pellet of the positive electrode mixture 1; and the gasket 6 of nylon 66 coated with nylon 610 is set.

Next, alkaline electrolyte of sodium hydroxide aqueous solution of 28% by weight is dropped onto the non woven fabric of the separator 5 to be impregnated. Further, the gel-state negative electrode mixture 3 composed of zinc alloy powder without mercury, containing aluminum (Al), indium (In), and bismuth (Bi); thickener; and sodium hydroxide aqueous solution is loaded; and then the negative electrode cup 4 is mounted on the negative electrode mixture 3.

TABLE 1

| | Inside Diameter of Negative Electrode Cup mm (d) | Mask Opening Ratio % (A/d) | Mask Opening Diameter mm (A) | 2(2t + d) − B = 2(2*0.2 + 5.20) − 6.20 | Inside Surface Coating (*1) (visually confirmed) | Cuff Bottom Portion Coating (1*) (visually confirmed) | Liquid Leakage Occurrence Ratio % (45° C. RH93% after preserved 100 days) |
|---|---|---|---|---|---|---|---|
| Practice Example 1 | 5.20 | 80 | 4.16 | 5.0 > A | ○ | X | 0 |
| Practice Example 2 | 5.20 | 90 | 4.68 | 5.0 > A | ○ | X | 0 |
| Comparative Example 1 | 5.20 | 70 | 3.64 | 5.0 > A | Δ | X | 7 |
| Comparative Example 2 | 5.20 | 100 | 5.20 | 5.0 < A | ○ | Δ | 35 |
| Comparative Example 3 | 5.20 | −(*2) | −(*2) | — | ○ | ○ | 100 |

(*1) Evaluation of coating state ○: coated, Δ: coated but base material is seen, X: not coated
(*2) In comparative example 3, mask is not used.

Hereupon, in a practice example 1 of Table 1 the negative electrode cup 4 is formed as follows. First, a three-layer clad member made of nickel 7, stainless 8, and copper 9, having the plate thickness t=0.2 mm is pressed to form, as shown in FIG. 4, a negative electrode cup having the inside diameter d=5.20 mm of an alkaline battery, for example, SR626SW.

Next, the mask 11 for partly forming a film is prepared, in which the thickness of the mask on the negative electrode cup mounting side is 0.2 mm in FIG. 2.

Then, the negative electrode cup 4 is set on the mask 11 that covers the cuff portion 4a and cuff bottom portion 4b of the negative electrode cup 4 and sputtering is performed, so that the negative electrode cup 4 in which the coating layer 10 of approximately 0.01 μm made of stannum that is an example of metal having high hydrogen overpotential is provided on the inside surface area thereof.

Hereupon, when A is the diameter of opening of the mask 11 and d is the inside diameter of the negative electrode cup 4, A/d is defined as a mask opening ratio, and in the practice example 1, sputtering is performed with the opening ratio of mask 11 on the negative electrode cup mounting side being 80% (opening diameter A=4.16 mm) and opening diameter of mask 11 on the cup supplying side B being 6.20 mm, that Then, the positive electrode can 2 is swaged and caulked to manufacture an alkaline battery, for example, SR626SW in button shape and the alkaline battery of the practice example 1 is thus obtained.

Further, the negative electrode cup 4 of a practice example 2 in Table 1 is subjected to sputtering similar to the practice example 1 except that the opening ratio of the mask 11 on the negative electrode cup mounting side A/d is 90% (opening diameter A=4.68 mm). In this case, 2(2t+d)−B=5.0 mm>A(=4.68 mm) is obtained. The above negative electrode cup 4 is used in an alkaline battery of the practice example 2, the other structure of which is similar to the practice example 1, to manufacture the alkaline battery of button shape, such as SR626SW.

Further, the negative electrode cup 4 of a comparative example 1 in Table 1 is subjected to sputtering similar to the practice example 1 except that the opening ratio of mask 11 on the negative electrode cup mounting side A/d is 70% (opening diameter A=3.64 mm). In this case, 2(2t+d)−B=5.0 mm>A(=3.64 mm) is obtained. The above negative electrode cup 4 is used in an alkaline battery of the comparative example 1, the other structure of which is similar to the practice example 1, to manufacture the alkaline battery of button shape, such as SR626SW.

Further, the negative electrode cup 4 of a comparative example 2 in Table 1 is subjected to sputtering similar to the practice example 1 except that the opening ratio of mask 11 on the negative electrode cup mounting side A/d is 100% (opening diameter A=5.20 mm). In this case, 2(2t+d)−B=5.0 mm<A(=5.20 mm) is obtained. The above negative electrode cup 4 is used in an alkaline battery of the comparative example 2, the other structure of which is similar to the practice example 1, to manufacture the alkaline battery of button shape, such as SR626SW.

Further, the negative electrode cup 4 of a comparative example 3 in Table 1 is subjected to sputtering similar to the comparative example 1 except that the mask is not used. The above negative electrode cup 4 is used in an alkaline battery of the comparative example 3, the other structure of which is similar to the practice example 1, to manufacture the alkaline battery of button shape, such as SR626SW.

One hundred alkaline batteries for each of the above described practice examples 1, 2, and comparative examples 1 to 3 are prepared to be preserved in the environment of 45° C. in temperature and at 93% relative humidity for one hundred days; and then a liquid leakage occurrence ratio is measured.

alkaline electrolyte is prevented from increasing and the liquid leakage resistance is improved.

Furthermore, according to the experimental results shown in Table 1, when the mask opening ratio A/d is 80% or 90%, the liquid leakage occurrence becomes 0%; and those results are favorable, compared to the examples in which the ratio A/d is 70% or 100%. Accordingly, when the relationship of 1>A/d≧0.8 is satisfied, the liquid leakage resistance can be improved.

Moreover, according to this embodiment, as shown in a practice example 3 of Table 2, since a taper is provided at the opening of mask 11 on the negative electrode cup mounting side, which satisfies the formulas (2) and (3) where A is the diameter of mask opening on the negative electrode cup mounting side, C is the thickness of mask on the negative electrode cup mounting side, h is the depth of the negative electrode cup, and D is the tapered angle of the mask opening on the mounting side of negative electrode cup, sputtering atoms entering the negative electrode cup 4 in the oblique direction are not blocked by the mask even if the mask is made thicker, so that the film thickness of the inside wall portion of the negative electrode cup 4 is prevented from becoming thin to provide a suitable mask used for mass production.

TABLE 2

| | Mask Opening Ratio % (A/d) | Tapered Angle of Mask Opening on Negative Electrode Cup Mounting Side (D) | Depth of Mask Opening from Negative Electrode Cup Mounting Side mm (E) | Thickness of Mask on Negative Electrode Cup Mounting Side mm (C) | A/2 − h = 4.68/2 − 1.0 | Inside Surface Coating (*1) (visually confirmed) | Liquid leakage Occurrence Ratio % (45° C. RH93% after preserved 100 days) |
|---|---|---|---|---|---|---|---|
| Practice Example 3 | 90 (4.68/5.20) | 45 | 4.68 | 1.00 | 1.34 > C | ○ | 0 |
| Comparative Example 4 | 90 (4.68/5.20) | - (without taper) | 0.20 | 0.20 | 1.34 > C | ○ | 0 |
| Comparative Example 5 | 90 (4.68/5.20) | - (without taper) | 4.68 | 4.68 | 1.34 < C | X | 60 |

(*1) Evaluation of coating state ○: coated, Δ: coated but base material is seen, X: not coated As a result, as shown in Table 1, each of the alkaline batteries of the practice examples 1 and 2, where a negative electrode cup 4, which uses a mask having the shape that satisfies the formula (1) and in which the stannum coating layer 10 is provided on the inside surface area other than the cuff bottom portion 4b, is used, has proved that the liquid leakage occurrence ratio in the environment of 45° C. in temperature and at 93% relative humidity is lower than the alkaline batteries of comparative examples 1 to 3, where a negative electrode cup 4 which uses a mask having the shape that does not satisfy the formula (1) and in which the stannum coating layer 10 is provided.

The reason why the above results were obtained is assumed that in alkaline batteries of the practice examples 1 and 2, if the position of the negative electrode cup 4 is shifted on the cup mounting periphery portion 11c of the mask 11 when the negative electrode cup 4 is coated, the cuff portion 4a and cuff bottom portion 4b thereof are not exposed to the inside of the opening of mask and the cuff portion 4a and cuff bottom portion 4b of the negative electrode cup 4 are not coated with the stannum coating layer 10; and since the stannum coating layer 10 is coated by means of sputtering that is a dry-type film forming method, the cuff portion 4a and cuff bottom portion 4b of the negative electrode cup 4 are not oxidized due to the film formation, so that the rising-up (creep phenomenon) of the In Table 2, the mask used to form the coating has the mask opening ratio of A/d=90%, and the shape of the mask opening on the negative electrode cup mounting side is varied to perform the coating and obtain the negative electrode cup 4; and then, using the negative electrode cup an alkaline battery in button shape as shown in FIG. 3 is manufactured. Specifically, in a practice example 3 of Table 2 the negative electrode cup 4 is formed as follows. First, a three-layer clad member made of nickel 7, stainless 8, and copper 9, having the plate thickness t=0.2 mm is pressed and formed a negative electrode cup 4 of an alkaline battery shown in FIG. 3, for example, SR626SW.

Next, a mask used in sputtering for partly forming a film is provided. In the practice example 3, the mask for partly forming a film is provided in which the depth of the negative electrode cup is h=1.0 mm, the diameter of the mask opening on the negative electrode cup mounting side is A=4.68 mm, the thickness of the mask on the negative electrode cup mounting side is C=1.0 mm, the depth of the mask opening from the negative electrode cup mounting surface 11d is E=4.68 mm, the tapered angle of the mask opening on the negative electrode cup mounting side is D=45°, and the taper is provided to cover the cuff portion 4a and cuff bottom portion 4b of the negative electrode cup 4. The mask satisfies (A/2)−h=1.34 mm>C(=1.0 mm)

Then, as shown in FIG. 2, the above negative electrode cup 4 is set on the mask 11 having the taper that covers the cuff portion 4a and cuff bottom portion 4b of the negative electrode cup 4, in which by sputtering the inside surface area is coated with the stannum coating layer 10 having the thickness of 0.01 μm.

In the practice example 3, the above described negative electrode cup 4 is used, and subsequently, the similar process to the practice example 1 in Table 1 is used to manufacture an alkaline battery in button shape, for example SR626SW, as shown in FIG. 3.

Further, in a comparative example 4 of Table 2, the mask for partly forming a film is provided in which the depth of negative electrode cup is h=1.0 mm, the diameter of the mask opening is A=4.68 mm, the thickness of the mask on the negative electrode cup mounting side and the depth of the mask opening from the negative electrode cup mounting surface 11d are C=E=0.20 mm, and accordingly, the tapered angle is not provided at the mask opening on the negative electrode cup mounting side to be (A/2)−h=1.34 mm>C (=0.20 mm) and cover the cuff portion 4a and cuff bottom portion 4b of negative electrode cup 4.

The negative electrode cup 4 in the comparative example 4 uses the above mask, and similarly to the practice example 1 the inside surface area other than the cuff portion 4a and cuff bottom portion 4b of the negative electrode cup 4 is provided by sputtering the stannum coating layer 10 of 0.01 μm in thickness.

An alkaline battery of the comparative example 4 uses the above described negative electrode cup 4, and the other process similar to the practice example 1 is taken to manufacture the alkaline battery in button shape, for example, SR626SW.

Further, in a comparative example 5 of Table 2, the mask for partly forming a film is provided in which the depth of negative electrode cup is h=1.0 mm, the diameter of the mask opening is A=4.68 mm, the thickness of the mask on the negative electrode cup mounting side and the depth of the mask opening from the negative electrode cup mounting surface lid are C=E=4.68 mm, the tapered angle is not provided at the mask opening on the negative electrode cup mounting side to be (A/2)−h=1.34 mm<C(=4.68 mm) and cover the cuff portion 4a and cuff bottom portion 4b of negative electrode cup 4.

The negative electrode cup 4 in the comparative example 5 uses the above mask, and similarly to the practice example 1 the inside surface area other than the cuff portion 4a and cuff bottom portion 4b of the negative electrode cup 4 is coated by sputtering with the stannum coating layer 10 of 0.01 μm in thickness.

An alkaline battery of the comparative example 5 uses the above described negative electrode cup 4, and the other process similar to the practice example 1 is taken to manufacture the alkaline battery in button shape, for example, SR626SW.

One hundred alkaline batteries for each of the above described practice examples 3, and comparative examples 4, 5 are similarly to Table 1 prepared to be preserved in the environment of 45° C. in temperature and at 93% relative humidity for one hundred days; and then the liquid leakage occurrence ratio is measured.

As a result, as shown in Table 2, each of the alkaline batteries of practice example 3 and comparative example 4, where a negative electrode cup 4, which uses a mask having the shape that satisfies the formulas (2), (3) and in which the stannum coating layer 10 is provided on the inside surface area other than the cuff portion 4a and cuff bottom portion 4b of the negative electrode cup 4, is used, has proved that the liquid leakage occurrence ratio in the environment of 45° C. at 93% relative humidity is reduced greatly compared to the alkaline batteries of the comparative example 5, where the negative electrode cup 4 having the stannum coating layer 10 provided using a mask that has the shape not satisfying the formulas is used.

The reason why the above results were obtained is assumed that since the shape of the mask satisfies the formula (1), and further satisfies the formulas (2), (3) with which the taper is provided, first with the shape of mask satisfying the formula (1) the cuff bottom portion 4b of the negative electrode cup 4 is always mounted behind the negative electrode cup mounting periphery 11c and the cuff portion 4a and cuff bottom portion 4b of the negative electrode cup 4 are not coated with a film having a higher hydrogen overpotential than copper, so that rising-up of alkaline electrolyte (creep phenomenon) may be prevented from increasing.

Further, since predetermined portions were coated by sputtering of a dry-type film forming method, the copper surface of the cuff portion 4a and cuff bottom portion 4b of the negative electrode cup 4 is not oxidized through the film forming process, so that the creep phenomenon caused by the oxidation of the copper surface may be prevented from increasing.

Furthermore, since the shape of the mask satisfies the formulas (2) and (3), sputtering atoms entering the negative electrode cup 4 in the oblique direction are almost prevented from being blocked by the mask 11 despite the fact that the mask is thick and reach the desired inside surface area of the negative electrode cup 4, the inside surface area other than the cuff portion 4a and cuff bottom portion 4b can be provided with the stannum coating layer 10 having a higher hydrogen overpotential than copper, so that generation of hydrogen gas ($H_2$) is suppressed and as a result the liquid leakage resistance is improved.

As heretofore described, according to the embodiment of the present invention, the mask opening shape is selected to have a tapered angle with which uniformity in coating is not damaged even if a thicker mask is used in sputtering, so that the inside surface area other than the cuff portion 4a and cuff bottom portion 4b of the negative electrode cup 4 having the inside surface area formed of copper can be provided with the stannum (Sn) coating layer 10 having a higher hydrogen overpotential than copper and generation of hydrogen gas ($H_2$) is suppressed. Moreover, since the cuff portion 4a and cuff bottom portion 4b of the negative electrode cup 4 are not coated with stannum (Sn) having a higher hydrogen potential than copper and the coating is performed with a PVD method of a dry-type film forming method, the copper surface 9 of the cuff portion 4a and cuff bottom portion 4b of the negative electrode cup 4 is not oxidized when forming and processing a film, so that rising-up of alkaline electrolyte (creep phenomenon) is restrained from increasing and the liquid leakage resistance can be securely obtained.

Furthermore, since the thicker mask is used, deformation of the mask accompanied by formation, maintenance of a film and the like is reduced and the operating life of the mask is extended compared to conventional masks, to obtain a mask suitable for mass production of the negative electrode cup 4.

Further, needless to say, the present invention is not limited to the above described embodiment and various other structures can be taken without departing from the gist thereof.

As described above, according to the method for manufacturing an alkaline battery of the present invention, the inside surface area of the negative electrode cup is coated using a thicker mask having a opening with a tapered angle by means of a PVD method of dry-type film forming method to manufacture the alkaline battery using the negative electrode cup. Since the thick mask having an opening with a tapered angle not to interfere with the path of entering sputtering atoms is used to form a film, the film is favorably formed without damaging uniformity in the coating when sputtering is performed; and since only the inside surface area other than the cuff portion and cuff bottom portion made of copper of the negative electrode cup is coated with metal or metal alloy having a higher hydrogen overpotential than copper, generation of hydrogen gas ($H_2$) is restrained. Moreover, since the cuff portion and cuff bottom portion of the negative electrode cup are not coated with metal or metal alloy having a higher hydrogen potential than copper and the coating is performed with a PVD method of a dry-type film forming method, the copper surface of the cuff portion and cuff bottom portion of the negative electrode cup is not oxidized when forming and processing a film, so that only a predetermined area of the inside surface of the negative electrode cup is favorably coated with the stannum coating layer 10 and rising-up of alkaline electrolyte (creep phenomenon) is restrained from increasing. Furthermore, in the above thick mask having the shape in which an opening is provided with a tapered angle, the position dispersion of the negative electrode cup due to deformation of the mask caused by heat on sputtering and the deformation of the mask caused when excessive coating stuck to the mask is for example removed or cleaned, are reduced, so that the coating layer, in which compared to conventional masks the dispersion in the formed state of a film is small, can be formed; and since the operating life of the mask is extended, a mask suitable for use in mass production of the negative electrode cup is obtained.

According to the method for manufacturing an alkaline battery of the present invention, when the coating is performed, the inside surface area of the negative electrode cup is coated by means of the PVD method of a dry-type film forming method using the mask having the shape, in which the ratio of the inside diameter of the negative electrode cup d to the diameter of the mask opening on the negative electrode cup mounting side A is $1 > A/d \geq 0.8$, so that the coated area on the inside surface of the negative electrode cup becomes larger up to around the edge of the negative electrode cup and as a result an copper exposed portion can be made smaller to further restrain the generation of hydrogen gas ($H_2$) and the preservation characteristic and liquid leakage resistance can be improved.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for manufacturing an alkaline battery in which silver oxide or manganese dioxide is a positive active material, zinc or zinc alloy powder without containing mercury is a negative active material, a separator and a gasket are provided between positive electrode mixture and negative electrode mixture, the inside surface of a negative electrode cup having alkaline electrolyte injected is coated with metal or metal alloy having a higher hydrogen overpotential than copper, and said coating process is performed by means of a PVD method such as deposition, sputtering, ion plating or the like, wherein said coating is provided using a mask having the shape that satisfies:

$2(2t+d) - B \geq A \geq 0.7d$, where d is the inside diameter of the negative electrode cup, t is the plate thickness of the negative electrode cup, A is the diameter of the mask opening on the negative electrode cup mounting side, B is the diameter of the mask opening on the negative electrode cup supplying side and, the position of the negative electrode cup is shifted on a cup mounting surface toward a side wall of the mask opening on the mounting side of the negative electrode cup, a cuff bottom portion of the negative electrode cup is not exposed to the inside of the mask opening on the negative electrode cup mounting side, so that only the inside surface area of the negative electrode cup other than the cuff portion and cuff bottom portion is coated.

2. A method for manufacturing an alkaline battery according to claim 1, wherein said mask has the shape that satisfies $(A/2) - h \geq C > 0$ mm, where h is the depth of said negative electrode cup and C is the thickness of the mask on the negative electrode cup mounting side.

3. A method for manufacturing an alkaline battery according to claim 1, wherein said coating is provided using the mask having the mask opening on the negative electrode cup mounting side that includes a tapered angle D toward an interior of the mask opening that satisfies $90° > D > 45°$.

4. A method for manufacturing an alkaline battery according to claim 1, wherein said coating is provided using the mask having the shape in which a ratio of the inside diameter of the negative electrode cup d to the diameter of the mask opening on the negative electrode cup mounting side A satisfies $1 > A/d \geq 0.8$.

5. A method for manufacturing an alkaline battery according to claim 1, wherein said negative electrode cup is formed of a three-layer clad member of nickel, stainless and copper, and has a cuff portion and a cuff bottom portion formed on the outer periphery thereof.

6. A method for manufacturing an alkaline battery according to claim 1, wherein said coating is provided with stannum (Sn) having a higher hydrogen overpotential than copper (Cu) to form a stannum coating layer.

* * * * *